United States Patent
Breynaert

(10) Patent No.: US 6,867,515 B1
(45) Date of Patent: Mar. 15, 2005

(54) INTERFERENCE SUPPRESSION IN AN ENGINE WITH PERMANENT MAGNETS ACTIVATING A FUNCTIONAL MOTOR VEHICLE ELEMENT

(75) Inventor: François Breynaert, Caen (FR)

(73) Assignee: Meritor Light Vehicle Systems France (FR)

(*) Notice: Subject to any disclaimer, the term of this patent is extended or adjusted under 35 U.S.C. 154(b) by 0 days.

(21) Appl. No.: 09/601,545

(22) PCT Filed: Jan. 29, 1999

(86) PCT No.: PCT/FR99/00193
§ 371 (c)(1),
(2), (4) Date: Mar. 29, 2001

(87) PCT Pub. No.: WO99/40672
PCT Pub. Date: Aug. 12, 1999

(30) Foreign Application Priority Data

Feb. 3, 1998 (FR) .............................. 98 01231

(51) Int. Cl.⁷ .......................... H02K 5/24; H02K 11/00; H02K 13/06; H02K 13/10; H01R 39/46
(52) U.S. Cl. ........................... 310/51; 310/220; 310/71; 310/68 R
(58) Field of Search ............................... 310/51, 68 R, 310/71, 220

(56) References Cited

U.S. PATENT DOCUMENTS

| | | | |
|---|---|---|---|
| 4,323,804 A | * 4/1982 | Zelt | 310/72 |
| 4,329,605 A | 5/1982 | Angi et al. | 310/68 R |
| 4,384,223 A | * 5/1983 | Zelt | 310/68 R |
| 4,384,331 A | * 5/1983 | Fukuhara et al. | 364/431.12 |
| 4,429,241 A | * 1/1984 | Ohara et al. | 310/51 |
| 4,462,012 A | * 7/1984 | Kerber et al. | 333/12 |
| 4,645,159 A | 2/1987 | Terada et al. | 248/429 |
| 5,194,769 A | * 3/1993 | Ade et al. | 310/51 |
| 5,231,321 A | * 7/1993 | Takiguchi | 310/51 |
| 5,306,974 A | * 4/1994 | Bates | 310/68 R |
| 5,309,052 A | * 5/1994 | Kim | 310/51 |
| 5,717,270 A | * 2/1998 | Lau et al. | 310/220 |
| 5,821,662 A | * 10/1998 | Kajino et al. | 310/239 |
| 5,942,819 A | * 8/1999 | Burgess et al. | 310/51 |
| 5,949,173 A | * 9/1999 | Wille et al. | 310/220 |
| 6,078,117 A | * 6/2000 | Perrin et al. | 310/68 R |
| 6,229,226 B1 | * 5/2001 | Kramer et al. | 307/10.1 |
| 6,552,467 B1 | * 4/2003 | Suriano et al. | 310/249 |
| 6,608,410 B2 | * 8/2003 | Sato et al. | 310/67 R |

FOREIGN PATENT DOCUMENTS

| | | | | |
|---|---|---|---|---|
| DE | 019902433 C1 | * | 9/2000 | |
| EP | 0528611 | | 8/1992 | |
| EP | 08130848 | | 5/1996 | |
| FR | 2774525 | | 2/1998 | |
| JP | 63121447 A | * | 5/1988 | |
| JP | 05328691 A | * | 12/1993 | |
| JP | 2000116093 A | * | 4/2000 | .......... H02K/23/00 |
| WO | WO 99/40672 | | 8/1999 | |

* cited by examiner

Primary Examiner—Burton S. Mullins
Assistant Examiner—Pedro J. Cuevas
(74) Attorney, Agent, or Firm—Carlson, Gaskey & Olds

(57) ABSTRACT

The invention concerns an interference suppression system in an engine with permanent magnets activating a functional motor vehicle element, wherein the engine (1) comprises powering brushes (8, 9), connected to an external power source (12) with wires (10, 1) and a metal field magnet frame (2). The invention is characterized in that each brush (8, 9) is connected to the engine metal field magnet frame (2) through at least an interference suppression capacitor (13, 14) and the engine (1) metal field magnet frame (2) is connected to the vehicle earth connection (15).

10 Claims, 1 Drawing Sheet

Figure 1:
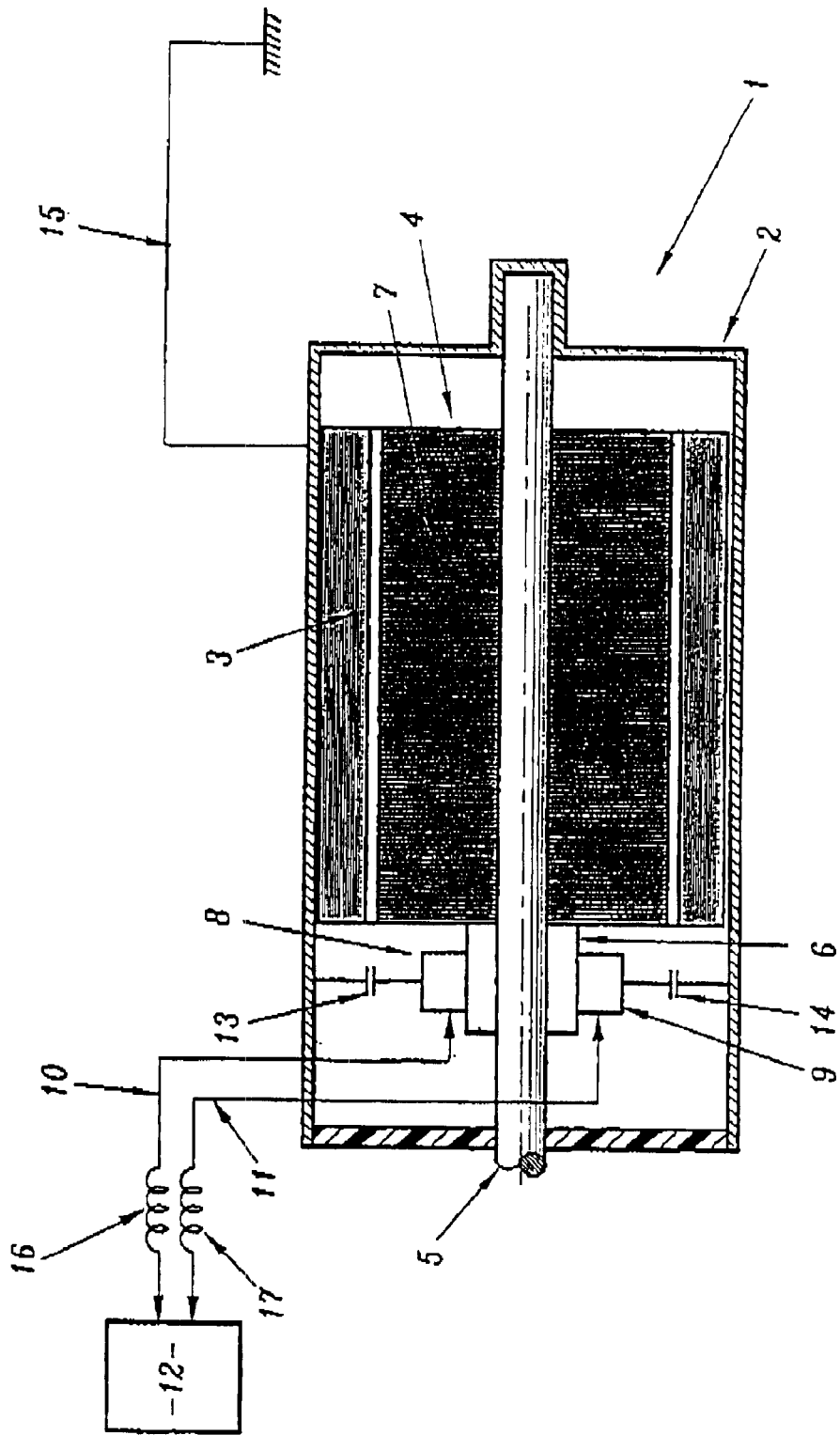

INTERFERENCE SUPPRESSION IN AN ENGINE WITH PERMANENT MAGNETS ACTIVATING A FUNCTIONAL MOTOR VEHICLE ELEMENT

The present invention relates to a noise suppression, system for a permanent-magnet motor for activating a functional device in a motor vehicle.

In general, such motors include supply brushes associated with a commutator and connected to an external power supply by supply leads.

In addition, such motors also generally include a metal casing.

A certain number of noise suppression systems for these motors have already been developed in the prior art.

However, all these systems have proved to be relatively ineffective or to have too high a manufacturing cost for a general application to this type of motor.

The object of the invention is therefore to solve these problems.

For this purpose, the subject of the invention is a noise suppression system for a permanent-magnet motor for activating a functional device in a motor vehicle, in which the motor includes supply brushes connected to an external power supply by leads and a metal casing, characterized in that each brush is connected to the metal casing of the motor through at least one noise suppression capacitor, in that the metal casing of the motor is connected to the vehicle's earth and in that the metal casing of the motor and the functional device have complementary means for earthing the casing.

The invention will be more clearly understood with the aid of the description which follows, given solely by way of example and with reference to the appended drawing, which shows a schematic diagram illustrating the general structure of a noise suppression system for a permanent-magnet motor according to the invention.

This FIGURE shows the general structure of a permanent-magnet motor for activating, for example, a functional device in a motor vehicle, this motor being denoted by the general reference number 1.

This motor has, for example, a metal casing denoted by the general reference number 2, in which, for example, permanent magnets denoted by the general reference number 3 and a rotating part denoted by the general reference number 4 are placed, the said rotating part being provided with a shaft 5 on which, for example, a commutator denoted by the general reference number 6 and other devices of conventional type, denoted by the general reference number 7, are placed.

The commutator 6 is associated with supply brushes, for example 8 and 9, which are connected by supply leads, for example 10 and 11, to a power supply external to the motor, denoted by the general reference number 12 in this FIGURE.

According to the invention, each supply brush, that is to say the brushes 8 and 9, is connected to the metal casing 2 of the motor through at least one noise suppression capacitor, such as the capacitors 13 and 14, and the metal casing 2 of the motor is connected to the vehicle's earth, for example at 15, in any suitable manner, as will be described in greater detail below.

In fact, this makes it possible to form two noise suppression circuits essentially of the LC type of the brushes, in so far as the leads 10 and 11 have a certain intrinsic inductance.

These leads may also be associate with specific inductors, such as the inductors denoted by the general reference numbers 16 an 17 in this FIGURE, or they may consist of a ferrite-loaded wires of conventional type, that is to say in which the conducting core of these wires is placed in a ferrite sheath which is itself surrounded by a layer of insulating material.

Such a structure therefore makes it possible to match the characteristics of the LC circuits to the desired noise suppression characteristics.

The metal casing 2 of the motor may, as described above, be connected to the vehicle's earth in any suitable manner.

Thus, for example, this casing may be connected to the vehicle's earth through an earthing braid or a supporting piece of the functional device with which the motor is associated, etc.

Thus, for example, the metal casing of the motor may be earthed by a piece for fastening this motor to the rest of the functional device.

For example, if the activating motor is a motor for activating a so-called motor-operated adjustable seat of a motor vehicle, the metal casing of the motor may be connected to the vehicle's earth through the slideway of the seat or other device.

It is thus understood that such a structure then has a certain of advantages, especially with regard to its simplicity and therefore its production cost.

What is claimed is:

1. Noise suppression system for a permanent-magnet motor for activating a functional device in a motor vehicle, in which the motor (1) includes supply brushes (8, 9) connected to an external power supply (12) by leads (10, 11) and a metal casing (2), characterized in that each brush (8, 9) is separately connected to the metal casing (2) of the motor (1) through at least one noise suppression capacitor (13, 14), in that the metal casing (2) of the motor (1) is connected to the vehicle's earth (at 15) and in that the metal casing (2) of the motor and the functional device have complementary means for earthing the casing.

2. System according to claim 1, characterized in that the supply leads (10, 11) are associated with inductors (16, 17).

3. System according to claim 1, characterized in that the supply leads (10, 11) are associated with inductors (16, 17) formed by ferrite-loaded wires.

4. System according to claim 1, characterized in that the means for earthing the casing of the motor comprise means for fastening this motor to the functional device.

5. A noise suppression system for a motor comprising:
   a casing;
   a shaft rotatable relative to said casing having an output for activating a vehicle functional device;
   a plurality of brushes supported by said shaft and connected to a power supply external to said casing; and
   a plurality of capacitors with at least one of said capacitors separately connecting each of said brushes to said casing for suppressing noise.

6. A system according to claim 5 wherein said casing is grounded.

7. A system according to claim 6 wherein said casing is grounded via connection to said vehicle functional device.

8. A system according to claim 6 wherein each of said brushes is connected to said power supply lead forming a plurality of noise suppression circuits.

9. A system according to claim 8 including a plurality of inductors with at least one inductor being associated with each of said supply leads.

10. A system according to claim 8 wherein each of said supply leads are formed by ferrite-loaded wires.

* * * * *